(12) United States Patent
Ho et al.

(10) Patent No.: US 8,330,047 B2
(45) Date of Patent: Dec. 11, 2012

(54) PRINTED CIRCUIT BOARD

(75) Inventors: Voonyee Ho, Ibaraki (JP); Katsutoshi Kamei, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 321 days.

(21) Appl. No.: 12/409,544

(22) Filed: Mar. 24, 2009

(65) Prior Publication Data

US 2009/0250252 A1   Oct. 8, 2009

Related U.S. Application Data

(60) Provisional application No. 61/044,917, filed on Apr. 15, 2008.

(30) Foreign Application Priority Data

Apr. 2, 2008  (JP) ................................. 2008-095840

(51) Int. Cl.
*H05K 1/00*      (2006.01)

(52) U.S. Cl. ..... 174/250; 174/251; 360/246; 360/245.9; 361/770

(58) Field of Classification Search ................... 360/246, 360/264.2, 245.8, 244, 240, 266.3
See application file for complete search history.

(56) References Cited

U.S. PATENT DOCUMENTS

| | | | | |
|---|---|---|---|---|
| RE36,396 E | * | 11/1999 | Arthur et al. | 428/331 |
| 5,986,893 A | * | 11/1999 | Leigh et al. | 361/777 |
| 5,995,328 A | * | 11/1999 | Balakrishnan | 360/245.9 |
| 7,019,401 B2 | * | 3/2006 | Chang et al. | 257/758 |
| 7,019,959 B2 | * | 3/2006 | Chua | 361/329 |
| 2004/0070884 A1 | | 4/2004 | Someya et al. | |
| 2006/0028295 A1 | * | 2/2006 | Piernas | 333/116 |

FOREIGN PATENT DOCUMENTS

| | | |
|---|---|---|
| CN | 1504066 A | 6/2004 |
| JP | 2004-133988 A | 4/2004 |

OTHER PUBLICATIONS

Office Action issued Oct. 31, 2011 in counterpart CN Application No. 200910133622.0 and an English translation thereof.

* cited by examiner

*Primary Examiner* — Tuan T Dinh
*Assistant Examiner* — Steven Sawyer
(74) *Attorney, Agent, or Firm* — Panitch Schwarze Belisario & Nadel LLP

(57) ABSTRACT

A first insulating layer is formed on a suspension body and a wiring trace is formed on the first insulating layer. In addition, a ground trace is formed on the first insulating layer so as to extend along the wiring trace on one side of the wiring trace with a spacing therebetween. A second insulating layer is formed on the first insulating layer to cover the wiring trace and the ground trace. On the second insulating layer, a wiring trace is formed at a position above the wiring trace. A third insulating layer is formed on the second insulating layer to cover the wiring trace. The width of the wiring trace is set larger than the width of the wiring trace. At least a partial region of the ground trace and at least a partial region of the wiring trace are opposite to each other with part of the second insulating layer sandwiched therebetween.

8 Claims, 8 Drawing Sheets

F I G. 2
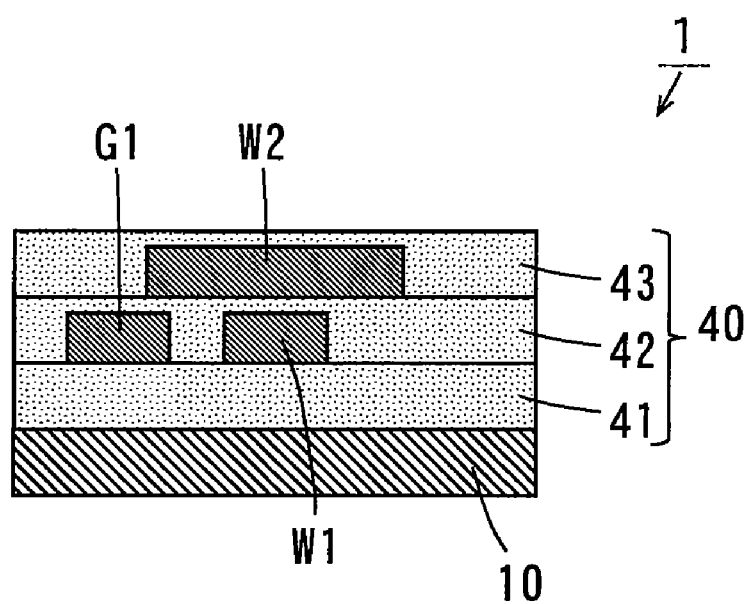

F I G. 6
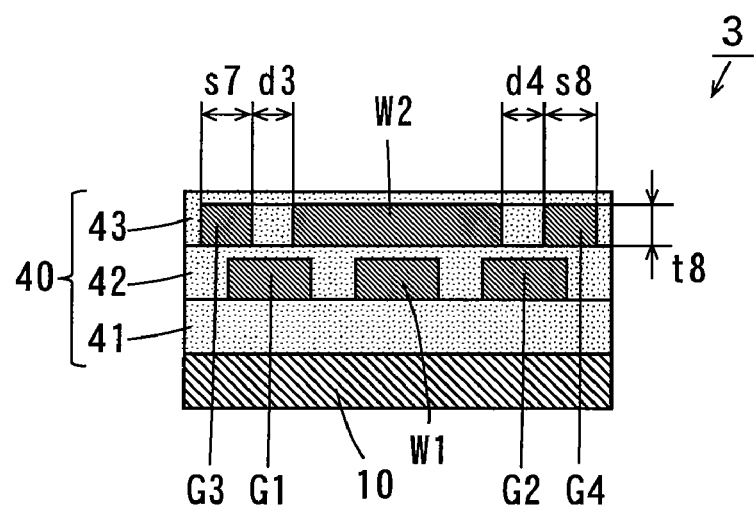
F I G. 7
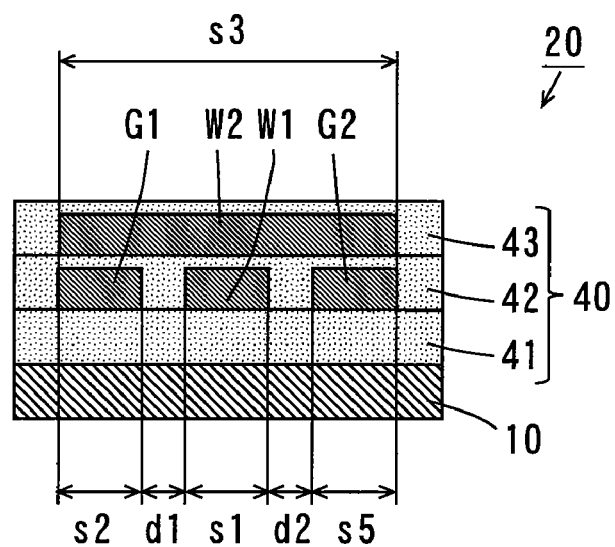

F I G. 8
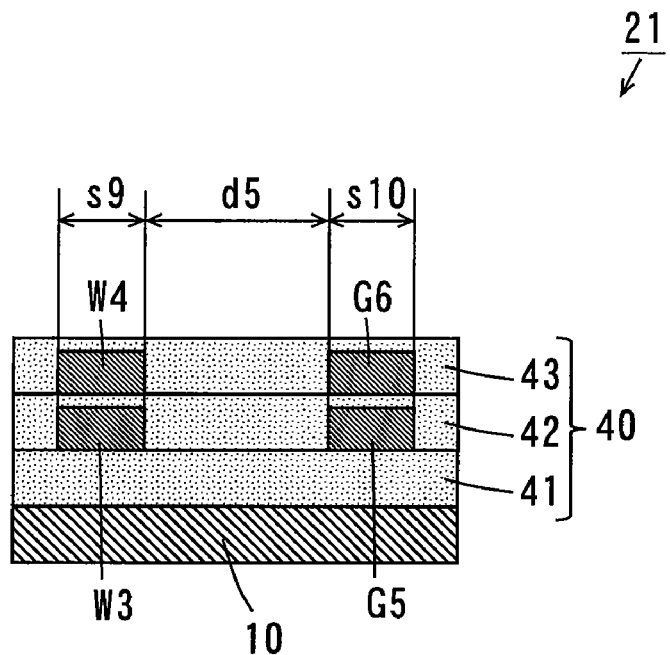
F I G. 9
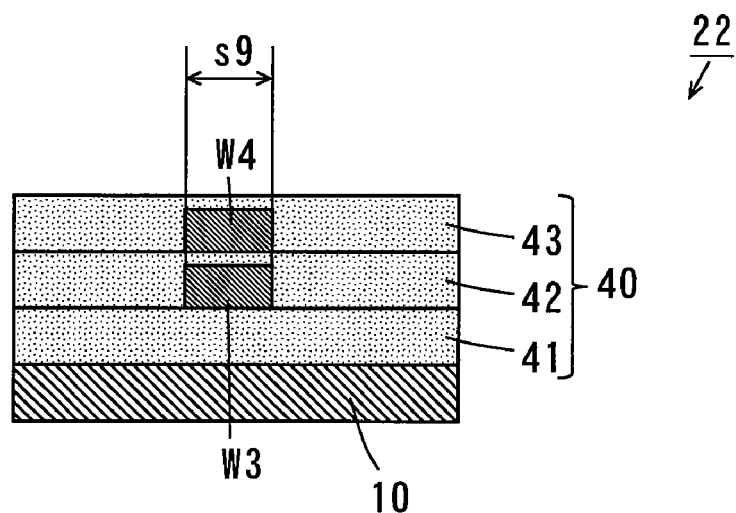

PRINTED CIRCUIT BOARD

BACKGROUND OF THE INVENTION

1. Field of the Invention

The present invention relates to a printed circuit board.

2. Description of the Background Art

An actuator is used in a drive such as a hard disk drive. Such an actuator includes an arm arranged rotatably with respect to a rotation shaft and a suspension board used for a magnetic head that is attached to the arm. The suspension board is a printed circuit board for positioning the magnetic head with a desired track of a magnetic disk.

FIG. 11 is a vertical sectional view showing one example of a conventional suspension board. In the suspension board 900 of FIG. 11, an insulating layer 903 is formed on a metal substrate 902. A pair of write conductors W1, W2 and a pair of read conductors R1, R2 are formed so as to be arranged in sequence on the insulating layer 903.

One ends of the conductors W1, W2, R1, R2 are connected to a magnetic head (not shown). The other ends of the conductors W1, W2, R1, R2 are electrically connected to a write electrical circuit (not shown) and a read electrical circuit (not shown), respectively.

When a write current flows through the write conductors W1, W2, induced electromotive forces are generated in the read conductors R1, R2 by electromagnetic induction in the suspension board 900.

Here, the distance between the write conductors W1, W2 and the read conductor R1 is smaller than the distance between the write conductors W1, W2 and the read conductor R2. This causes a difference in the induced electromotive forces generated in the read conductors R1, R2. As a result, a current flows through the read conductors R1, R2. That is, a crosstalk occurs between the write conductors W1, W2 and the read conductors R1, R2.

Therefore, JP 2004-133988 A proposes a printed circuit board shown in FIG. 12 for preventing the occurrence of the crosstalk between the write conductors W1, W2 and the read conductors R1, R2.

FIG. 12 is a vertical sectional view showing another example of the conventional suspension board. In the suspension board 910, a first insulating layer 904 is formed on the metal substrate 902. The write conductor W2 and the read conductor R2 are formed to be spaced apart from each other by a distance L1 on the first insulating layer 904.

A second insulating layer 905 is formed on the first insulating layer 904 to cover the write conductor W2 and the read conductor R2. On the second insulating layer 905, the write conductor W1 is formed at a position above the read conductor R2, and the read conductor R1 is formed at a position above the write conductor W2.

The distance between the read conductor R1 and the write conductor W2 that are positioned one above the other and the distance between the read conductor R2 and the write conductor W1 that are positioned one above the other are L2, respectively.

In the suspension board 910 of FIG. 12 having the foregoing configuration, the distances between the write conductors W1, W2 and the read conductor R1 are substantially equal to the distances between the write conductors W1, W2 and the read conductor R2, respectively. Accordingly, it is considered that the magnitudes of the induced electromotive forces generated in the read conductors R1, R2 are substantially equal when the write current flows through the write conductors W1, W2.

In the suspension boards 900, 910 shown in FIGS. 11 and 12, impedances of the conductors W1, W2, R1, R2 vary depending on the magnitudes of coupling capacitances between the conductors W1, W2, R1, R2 and the metal substrate 902.

Here, the distance between the write conductor W1 and the metal substrate 902 is different from the distance between the write conductor W2 and the metal substrate 902 in the suspension board 910 of FIG. 12. Moreover, the distance between the read conductor R1 and the metal substrate 902 is different from the distance between the read conductor R2 and the metal substrate 902.

In this case, the coupling capacitance between the write conductor W1 and the metal substrate 902 is different from the coupling capacitance between the write conductor W2 and the metal substrate 902. Moreover, the coupling capacitance between the read conductor R1 and the metal substrate 902 is different from the coupling capacitance between the read conductor R2 and the metal substrate 902.

Therefore, a difference occurs in the impedances of the write conductor W1 and the write conductor W2, and a difference occurs in the impedances of the read conductor R1 and the read conductor R2 in the configuration of the suspension board 910. This may cause a transmission error of a differential signal through the write conductors W1, W2 and cause a transmission error of a differential signal through the read conductors R1, R2.

SUMMARY OF THE INVENTION

An object of the present invention is to provide a printed circuit board in which a signal transmission error can be sufficiently prevented.

(1) According to an aspect of the present invention, a printed circuit board includes a conductive substrate, a first insulating layer formed on the conductive substrate, a first wiring trace formed on the first insulating layer, a first ground trace formed on the first insulating layer so as to extend along the first wiring trace on one side of the first wiring trace with a spacing therebetween, a second insulating layer formed on the first insulating layer to cover the first wiring trace and the first ground trace, a second wiring trace formed on the second insulating layer, and a third insulating layer formed on the second insulating layer to cover the second wiring trace, wherein the first wiring trace and the second wiring trace are arranged to be opposite to each other with part of the second insulating layer sandwiched therebetween, the first and second wiring traces constitute a first signal line pair, a width of the second wiring trace is set larger than a width of the first wiring trace, at least a partial region of the first ground trace and at least a partial region of the second wiring trace are arranged to be opposite to each other with part of the second insulating layer sandwiched therebetween.

In the printed circuit board, the first insulating layer is formed on the conductive substrate, and the first wiring trace is formed on the first insulating layer. Moreover, the first ground trace is formed on the first insulating layer so as to extend along the first wiring trace on the one side of the first wiring trace with a spacing therebetween. In addition, the second insulating layer is formed on the first insulating layer to cover the first wiring trace and the first ground trace, and the second wiring trace is formed on the second insulating layer. Then, the third insulating layer is formed on the second insulating layer to cover the second wiring trace.

Here, the first and second wiring traces constitute the first signal line pair in the printed circuit board. Moreover, the first wiring trace and the second wiring trace are arranged to be opposite to each other with part of the second insulating layer sandwiched therebetween while the width of the second wiring trace is set larger than the width of the first wiring trace. Furthermore, at least the partial region of the first ground trace and at least the partial region of the second wiring trace are arranged to be opposite to each other with part of the second insulating layer sandwiched therebetween.

Such a configuration suppresses the occurrence of a difference between the impedance of the first wiring trace and the impedance of the second wiring trace. This sufficiently prevents a transmission error of a signal from occurring because of imbalance of the first signal line pair.

(2) The printed circuit board may further include a second ground trace formed on the first insulating layer so as to extend along the first wiring trace on the other side of the first wiring trace with a spacing therebetween, wherein at least a partial region of the second ground trace and at least a partial region of the second wiring trace may be arranged to be opposite to each other with part of the second insulating layer sandwiched therebetween.

In this case, the ground traces are provided on the both sides of the first wiring trace, thereby sufficiently suppressing the occurrence of the difference between the impedance of the first wiring trace and the impedance of the second wiring trace. This more sufficiently prevents the transmission error of the signal from occurring because of the imbalance of the first signal line pair.

(3) The printed circuit board may further include third and fourth ground traces formed on the second insulating layer so as to extend along the second wiring trace on one side and the other side of the second wiring trace respectively with spacings therebetween.

In this case, the ground traces are provided on the both sides of the second wiring trace, thereby sufficiently suppressing the occurrence of a crosstalk between the first signal line pair and another signal line pair.

(4) The printed circuit board may further include a head provided on the conductive substrate for reading and writing signals, wherein the first and second wiring traces may be electrically connected to the head.

In this case, the printed circuit board can be used as a suspension board of a drive such as a hard disk drive.

Moreover, writing or reading of information in/from a magnetic disk can be performed by the first signal line pair. In the case, a transmission error of a signal at the time of writing or reading can be sufficiently prevented.

According to the present invention, the occurrence of the difference between the impedance of the first wiring trace and the impedance of the second wiring trace can be suppressed. This sufficiently prevents the transmission error of the signal from occurring because of the imbalance of the first signal line pair.

Other features, elements, characteristics, and advantages of the present invention will become more apparent from the following description of preferred embodiments of the present invention with reference to the attached drawings.

BRIEF DESCRIPTION OF THE DRAWINGS

FIG. 2 is a vertical sectional view of the suspension board taken along the line A-A of FIG. 1.

FIG. 6 is sectional view showing a suspension board according to a third embodiment of the present invention.

FIG. 7 is a sectional view showing a suspension board of inventive examples 1 to 3.

FIG. 8 is a sectional view showing a suspension board of a comparative example 1.

FIG. 9 is a sectional view showing a suspension board of a comparative example 2.

DESCRIPTION OF THE PREFERRED EMBODIMENTS

Figure 1:
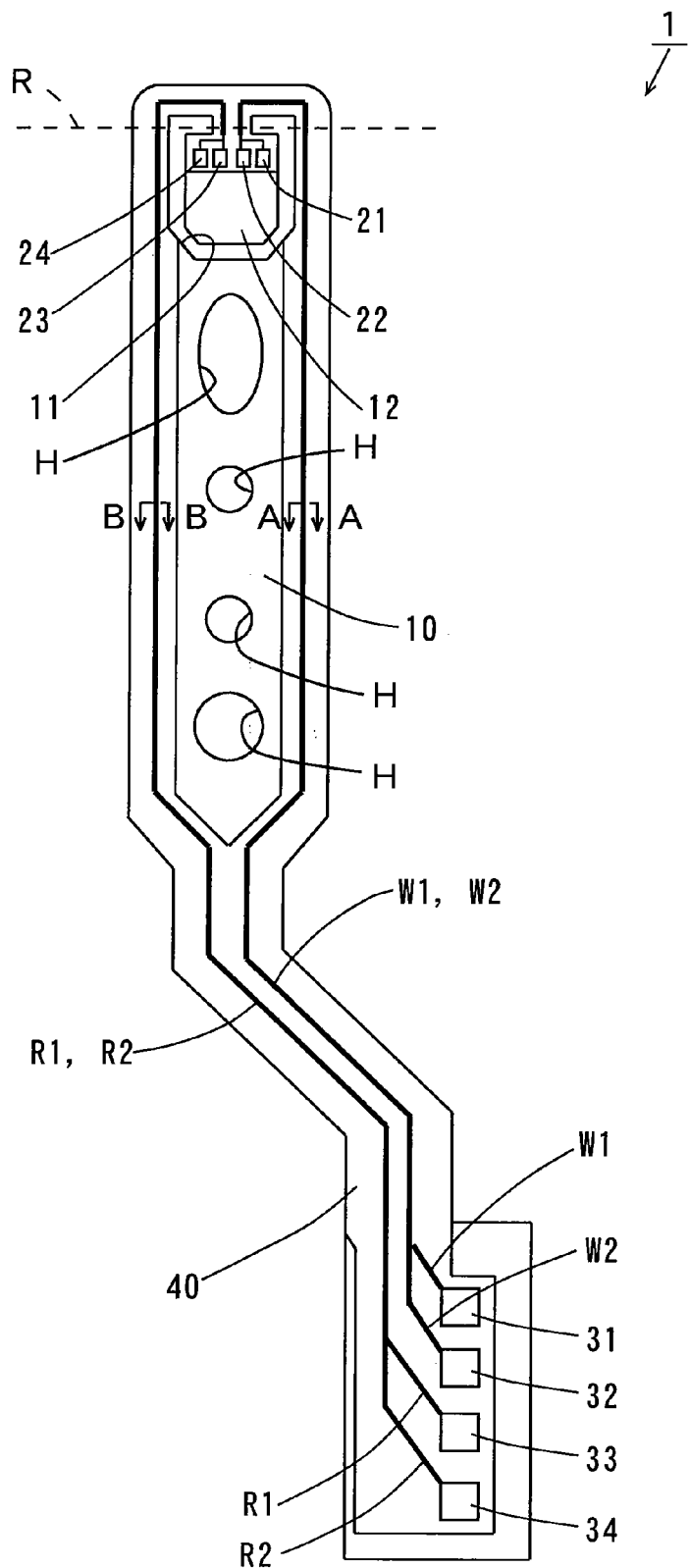
FIG. 1 is a plan view of a suspension board according to a first embodiment of the present invention.

Hereinafter, a printed circuit board and a method of manufacturing the same according to embodiments of the present invention will be described while referring to the drawings. The configuration and manufacturing method of a suspension board used in an actuator of a hard disk drive will be described as one example of the printed circuit board according to the embodiments of the present invention.

First Embodiment (1) Configuration of the Suspension Board

FIG. 1 is a top view of the suspension board according to a first embodiment of the present invention.

As shown in FIG. 1, the suspension board 1 includes a suspension body 10 formed of a long-sized metal substrate. Write wiring traces W1, W2 for writing information in a magnetic disk that is not shown and the read wiring traces R1, R2 for reading information from the magnetic disk are formed on the suspension body 10, as indicated by the bold solid lines.

At an end of the suspension body 10, a U-shaped opening 11 is formed, thereby providing a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected to one another by the wiring traces W1, W2, R1, R2, respectively. A plurality of holes H are formed in the suspension body 10.

In the suspension board 1, an insulating layer 40 composed of a plurality of layers is formed in a region where the plurality of wiring traces W1, W2, R1, R2 are formed to cover each of the wiring traces W1, W2, R1, R2.

Hereinafter, detail description will be made of the configuration of the suspension board 1 while referring to the drawings. FIG. 2 is a sectional view taken along the arrowed line A-A of FIG. 1. While FIG. 2 shows the configuration of a region in which the write wiring traces W1, W2 of the suspension board 1 are formed, the configuration of FIG. 2 also applies to a region in which the read wiring traces R1, R2 are formed (the cross section taken along the line B-B of FIG. 1, for example). In addition, the read wiring trace R1 is formed in the same manner as the write wiring trace W1, and the read wiring trace R2 is formed in the same manner as the write wiring trace W2.

As shown in FIG. 2, the insulating layer 40 is composed of first, second and third insulating layers 41, 42, 43. The first insulating layer 41 is formed on the suspension body 10.

The write wiring trace W1 and a ground trace G1 are formed on the first insulating layer 41. The write wiring trace W1 and the ground trace G1 are arranged in parallel with each other at a predetermined spacing.

The second insulating layer 42 is formed on the first insulating layer 41 to cover the write wiring trace W1 and the ground trace G1.

The write wiring trace W2 is formed at a position above the write wiring trace W1 on the second insulating layer 42. In the present embodiment, the write wiring traces W1, W2 are formed such that the centerline of the write wiring trace W1 and the centerline of the write wiring trace W2 overlap with each other.

The width of the write wiring trace W2 is set larger than that of the write wiring trace W1. Moreover, the ground trace G1 and the write wiring trace W2 are formed such that an upper surface of one edge portion of the ground trace G1 and a lower surface of one edge portion of the write wiring trace W2 are opposite to each other with the second insulating layer 42 sandwiched therebetween.

The third insulating layer 43 is formed on the second insulating layer 42 to cover the wiring trace W2.

In the hard disk that is not shown including the suspension board 1, a current flows through the pair of write wiring traces W1, W2 (FIG. 1) at the time of writing information in the magnetic disk. Moreover, the current flows through the pair of read wiring traces R1, R2 (FIG. 1) at the time of reading information from the magnetic disk.

(2) Manufacture of the Suspension Board

The method of manufacturing the suspension board 1 will be described. Description of respective steps of forming the tongue 12, the electrode pads 21 to 24, 31 to 34 and the holes H of FIG. 1 is omitted in the following. While the following description is made of the region in which the write wiring traces W1, W2 of the suspension board 1 are formed as an example for simplicity, the read wiring traces R1, R2 are similarly formed.

Figure 3:
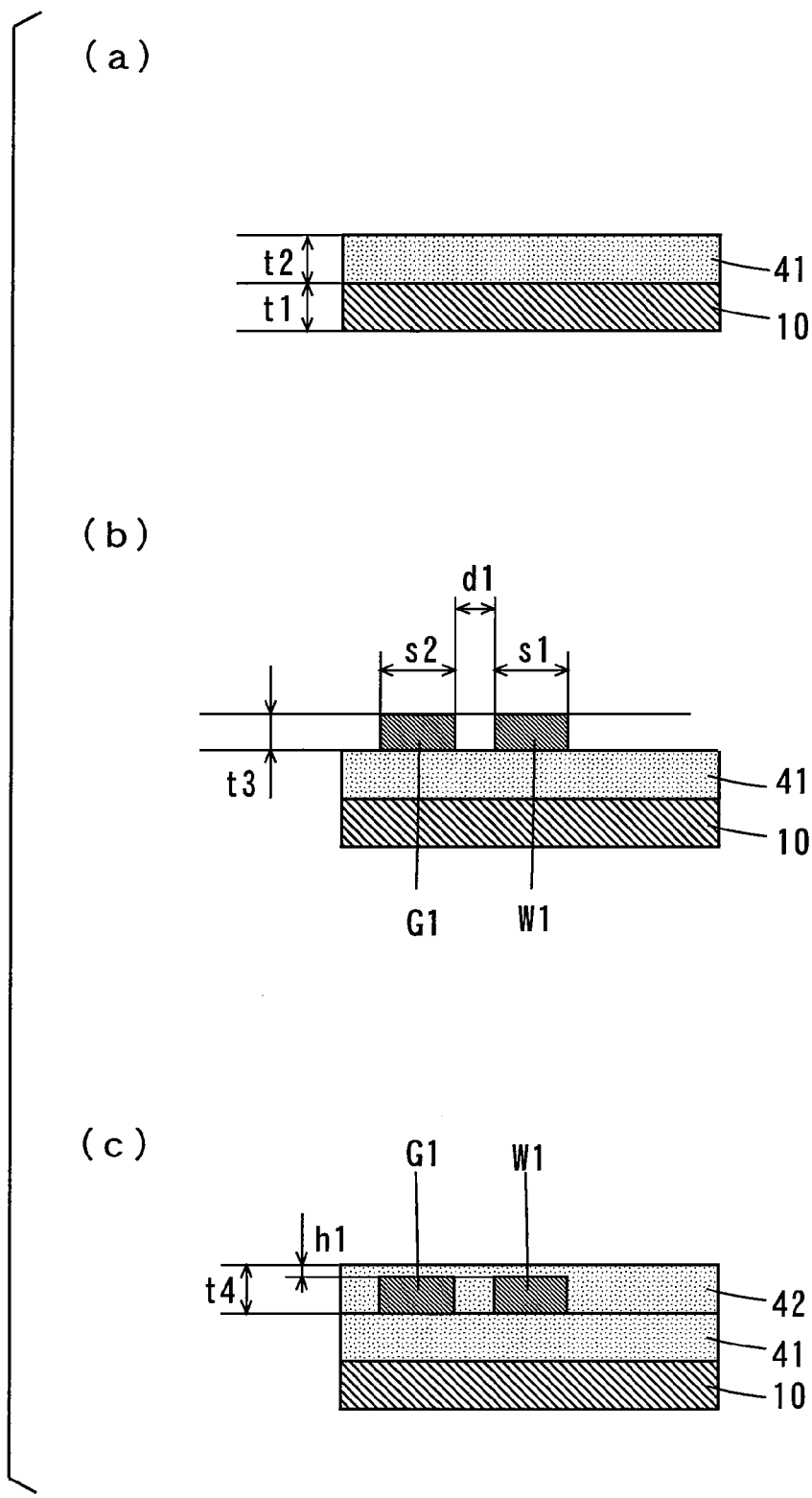
FIG. 3 is a diagram showing steps of manufacturing the suspension board according to the first embodiment.
Figure 4:
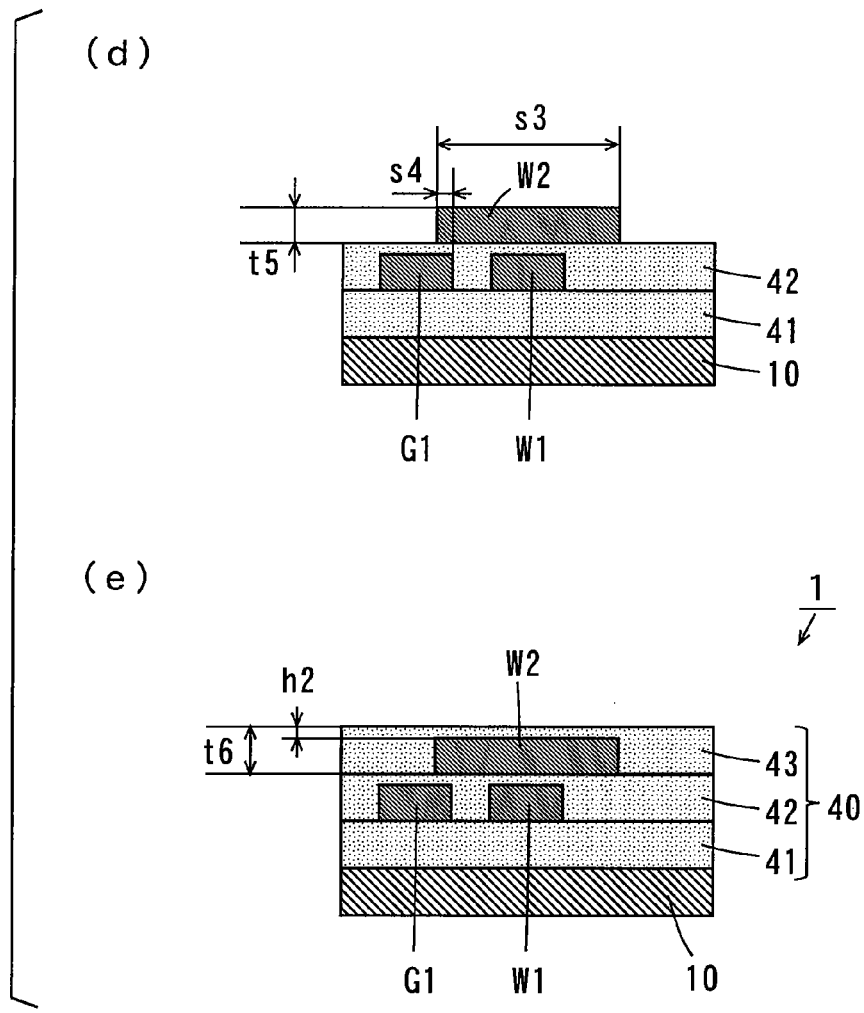
FIG. 4 is a diagram showing steps of manufacturing the suspension board according to the first embodiment.

FIGS. 3 and 4 are vertical sectional views showing steps of manufacturing the suspension board 1 according to the present embodiment. First, the long-sized substrate made of stainless steel (SUS) is prepared as the suspension body 10 as shown in FIG. 3(a). Then, the first insulating layer 41 mainly made of polyimide resin is formed on the suspension body 10.

A long-sized substrate made of another metal material such as copper (Cu) or aluminum (Al) instead of stainless steel may be used as the suspension body 10. The thickness t1 of the suspension body 10 is not less than 5 μm and not more than 50 μm, for example, and preferably not less than 10 μm and not more than 30 μm. The thickness t2 of the first insulating layer 41 is not less than 3 μm and not more than 20 μm, for example, and preferably not less than 5 μm and not more than 15 μm.

Then, the write wiring trace W1 and the ground trace G1 made of copper (Cu) are formed on the first insulating layer 41 as shown in FIG. 3(b). The write wiring trace W1 and the ground trace G1 are formed in parallel with each other at the predetermined spacing.

The write wiring trace W1 and the ground trace G1 may be formed using a semi-additive method, for example, and may be formed using another method such as a subtractive method.

The write wiring trace W1 and the ground trace G1 can be formed using another metal such as gold (Au) and aluminum or an alloy such as a copper alloy and an aluminum alloy, not limited to copper.

The thickness t3 of each of the write wiring trace W1 and the ground trace G1 is not less than 3 μm and not more than 16 μm, for example, and preferably not less than 6 μm and not more than 13 μm. The width s1 of the write wiring trace W1 is not less than 5 μm and not more than 40 μm, for example, and preferably not less than 10 μm and not more than 30 μm. The width s2 of the ground trace G1 is not less than 5 μm and not more than 40 μm, for example, and preferably not less than 10 μm and not more than 30 μm.

Note that the thickness of the write wiring trace W1 and the thickness of the ground trace G1 may be equal or different from each other. Moreover, the width of the write wiring trace W1 and the width of the ground trace G1 may be equal or different from each other.

The spacing d1 between the write wiring trace W1 and the ground trace G1 is not less than 5 μm and not more than 100 μm, for example, and preferably not less than 10 μm and not more than 60 μm.

In the above-described configuration, thin metal films may be formed between the first insulating layer 41 and the write wiring trace W1 and between the first insulating layer 41 and the ground trace G1, respectively. In this case, adhesion between the first insulating layer 41 and the write wiring trace W1 and between the first insulating layer 41 and the ground trace G1 is improved.

After that, the second insulating layer 42 mainly made of polyimide resin is formed on the first insulating layer 41 to cover the write wiring trace W1 and the ground trace G1 as shown in FIG. 3(c).

The thickness t4 of the second insulating layer 42 is not less than 4 μm and not more than 20 μm, for example, and preferably not less than 7 μm and not more than 17 μm. The thickness h1 between upper surfaces of the write wiring trace W1 and the ground trace G1 and an upper surface of the second insulating layer 42 is not less than 1 μm and not more than 5 μm, for example.

Next, the write wiring trace W2 made of copper is formed on the second insulating layer 42 as shown in FIG. 4(d). Here, the write wiring trace W2 is formed at the position above the write wiring trace W1. This causes the upper surface of the write wiring trace W1 and a lower surface of the write wiring trace W2 to be opposite to each other.

In addition, the write wiring trace W2 is formed such that the one edge portion of the write wiring trace W2 is positioned above the one edge portion of the ground trace G1. This causes a predetermined region of the upper surface of the one edge portion of the ground trace G1 and a predetermined region of the lower surface of the one edge portion of the write wiring trace W2 to be opposite to each other. Note that the write wiring trace W2 may be formed on the second insulating layer 42 to cover the whole upper surface of the ground trace G1.

The write wiring trace W2 is formed in the same manner as the write wiring trace W1. The write wiring trace W2 can be formed using another metal such as gold (Au) and aluminum or an alloy such as a copper alloy and an aluminum alloy, not limited to copper.

The thickness t5 of the write wiring trace W2 is not less than 3 μm and not more than 16 μm, for example, and preferably not less than 6 μm and not more than 13 μm. The width s3 of the write wiring trace W2 is not less than 5 μm and not more than 40 μm, for example, and preferably not less than 10 μm and not more than 30 μm.

The width s4 of the region, which is opposite to the ground trace G1, of the write wiring trace W2 is larger than 0 μm and not more than 100 μm, and preferably not less than 5 μm and not more than 40 μm.

A thin metal film may be formed between the second insulating layer 42 and the write wiring trace W2. In this case, adhesion between the second insulating layer 42 and the write wiring trace W2 is improved.

Finally, the third insulating layer 43 mainly made of polyimide resin is formed on the second insulating layer 42 to cover the write wiring trace W2, as shown in FIG. 4(e). Accordingly, the suspension board 1 is completed.

The thickness t6 of the third insulating layer 43 is not less than 4 μm and not more than 20 μm, for example, and preferably not less than 7 μm and not more than 17 μm. The thickness h2 of a portion of the third insulating layer 43 between an upper surface of the write wiring trace W2 and an upper surface of the third insulating layer 43 is not less than 1 μm and not more than 5 μm, for example.

Note that another resin material such as epoxy resin, acrylic resin, polyethernitrile resin, polyethersulfone resin, polyethylene terephthalate resin, polyethylene naphthalate resin and polyvinyl chloride resin instead of polyimide resin may be used for the first to third insulating layers 41 to 43.

The first to third insulating layers 41 to 43 may be formed of different insulating materials or the same insulating material.

The centerline of the write wiring trace W1 and the centerline of the write wiring trace W2 may not overlap with each other.

(3) Effects

In the suspension board 1 according to the present embodiment, the first insulating layer 41 is formed on the suspension body 10 and the write wiring trace W1 and the ground trace G1 are formed on the first insulating layer 41. Moreover, the second insulating layer 42 is formed on the first insulating layer 41 to cover the write wiring trace W1 and the ground trace G1, and the write wiring trace W2 is formed on the second insulating layer 42. Furthermore, the width of the write wiring trace W2 is set larger than that of the write wiring trace W1.

Such a configuration suppresses the occurrence of a difference between impedance of the write wiring trace W1 and impedance of the write wiring trace W2. This sufficiently prevents a transmission error of a differential signal from occurring because of imbalance between the write wiring traces W1, W2.

As a result, the occurrence of an error at the time of writing and reading information in/from the magnetic disk is reliably prevented in a hard disk, which is not shown, including the suspension board 1.

Second Embodiment

Figure 5:
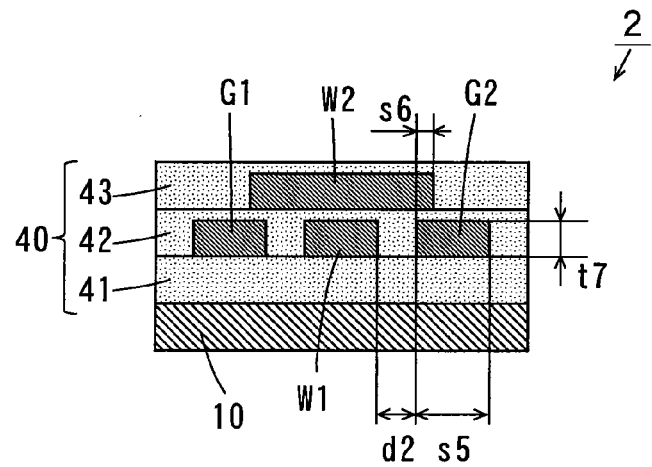
FIG. 5 is a sectional view showing a suspension board according to a second embodiment of the present invention.

FIG. 5 is a vertical sectional view showing a suspension board according to a second embodiment of the present invention.

The suspension board 2 according to the present embodiment is different from the suspension board 1 of FIG. 2 in the following points.

As shown in FIG. 5, the ground trace G1 is formed on one side of the write wiring trace W1, and a ground trace G2 is formed on the other side of the write wiring trace W1 on the first insulating layer 41 in the present embodiment. The ground trace G2 is formed in the same manner as the ground trace G1.

Note that the width s5 of the ground trace G2 is set the same as the width s2 (FIG. 3(b)) of the ground trace G1. The spacing d2 between the write wiring trace W1 and the ground trace G2 is set the same as the spacing d1 of FIG. 3(b). The thickness t7 of the ground trace G2 is set the same as the thickness t3 of FIG. 3(b). The width s6 of a region, which is opposite to the ground trace G2, of the write wiring trace W2 is set the same as the width s4 of FIG. 4(d).

In this manner, the ground traces G1, G2 are formed on the both sides of the write wiring trace W1, respectively, in the present embodiment. This sufficiently suppresses the occurrence of a difference between the impedance of the write wiring trace W1 and the impedance of the write wiring trace W2. This sufficiently prevents the transmission error of the differential signal from occurring because of the imbalance between the write wiring traces W1, W2.

Third Embodiment

FIG. 6 is a vertical sectional view showing a suspension board according to a third embodiment of the present invention.

The suspension board 3 according to the present embodiment is different from the suspension board 2 of FIG. 5 in the following points.

As shown in FIG. 6, a ground trace G3 is formed on one side of the write wiring trace W2 while a ground trace G4 is formed on the other side of the write wiring trace W2 on the second insulating layer 42 in the present embodiment. The ground traces G3, G4 are formed in the same manner as the ground trace G1.

Note that each of the widths s7, s8 of the ground traces G3, G4 is not less than 5 μm and not more than 40 μm, and preferably not less than 10 μm and not more than 30 μm. The thickness t8 of each of the ground traces G3, G4 is set the same as the thickness t5 of FIG. 4(d). Each of the spacing d3 between the ground trace G3 and the write wiring trace W2 and the spacing d4 between the ground trace G4 and the write wiring trace W2 is not less than 5 μm and not more than 40 μm, and preferably not less than 10 μm and not more than 30 μm.

In this manner, the ground traces G1, G2 are formed on the both sides of the write wiring trace W1 while the ground traces G3, G4 are formed on the both sides of the write wiring trace W2 in the present embodiment. This sufficiently prevents the occurrence of a crosstalk between the write wiring traces W1, W2 and another wiring trace while sufficiently suppressing the occurrence of a difference between the impedance of the write wiring trace W1 and the impedance of the write wiring trace W2.

INVENTIVE EXAMPLES AND COMPARATIVE EXAMPLES

Suspension boards of inventive examples and comparative examples were manufactured to be evaluated.

(1) Inventive Examples

FIG. 7 is a sectional view showing the suspension board of the inventive examples 1 to 3. Note that the basic configuration of the suspension board 20 shown in FIG. 7 is the same as the suspension board 2 of FIG. 5 except that the write wiring trace W2 is provided to cover the whole upper surfaces of the ground traces G1, G2 in the suspension board 20 of the inventive examples 1 to 3.

(1-1) Inventive Example 1

In the inventive example 1, the width s1 of the write wiring trace W1 was 30 μm, the width s3 of the write wiring trace W2 was 90 μm, each of the widths s2, s5 of the ground traces G1, G2 was 15 μm, each of the spacing d1 between the write wiring trace W1 and the ground trace G1 and the spacing d2 between the write wiring trace W1 and the ground trace G2 was 15 μm.

(1-2) Inventive Example 2

The inventive example 2 is different from the inventive example 1 in the following points. In the inventive example 2, the width s1 of the write wiring trace W1 was 40 μm, each of the widths s2, s5 of the ground traces G1, G2 was 12 μm, each of the spacing d1 between the write wiring trace W1 and the ground trace G1 and the spacing d2 between the write wiring trace W1 and the ground trace G2 was 13 μm.

(1-3) Inventive Example 3

The inventive example 3 is different from the inventive example 1 in the following points. In the inventive example 3, the width s1 of the write wiring trace W1 was 50 μm, each of the widths s2, s5 of the ground traces G1, G2 was 10 μm, each of the spacing d1 between the write wiring trace W1 and the ground trace G1 and the spacing d2 between the write wiring trace W1 and the ground trace G2 was 10 μm.

(2) Comparative Examples

(2-1) Comparative Example 1

FIG. 8 is a sectional view showing the suspension board of the comparative example 1.

As shown in FIG. 8, the suspension board 21 of the comparative example 1 includes the suspension body 10 and the insulating layer 40 that are the same as those of the suspension board 1 of FIG. 2. A write wiring trace W3 and a ground trace G5 are formed on the first insulating layer 41 to be covered with the second insulating layer 42. In addition, a write wiring trace W4 and a ground trace G6 are formed on the second insulating layer 42 to be covered with the third insulating layer 43.

Note that the write wiring traces W3, W4 are formed in the same manner as the write wiring trace W1 of FIG. 2, and the ground traces G5, G6 are formed in the same manner as the ground trace G1 of FIG. 2. The write wiring traces W3, W4 are formed such that the centerline of the write wiring trace W3 and the centerline of the write wiring trace W4 overlap with each other, and the ground traces G5, G6 are formed such that the centerline of the ground trace G5 and the centerline of the ground trace G6 overlap with each other.

The width s9 of each of the write wiring traces W3, W4 was 50 μm, and the width s10 of each of the ground traces G5, G6 was 30 μm. The spacing d5 between write wiring traces W3, W4 and the ground traces G5, G6 was 200 μm.

(2-2) Comparative Example 2

FIG. 9 is a sectional view showing the suspension board of the comparative example 2.

The suspension board 22 of the comparative example 2 is different from the suspension board 21 of the comparative example 1 in the following points.

As shown in FIG. 9, the ground traces G5, G6 (FIG. 8) were not provided in the suspension board 22 of the comparative example 2.

(3) Evaluation

(3-1) Evaluation of Characteristic Impedance

The characteristic impedances of the write wiring traces W1, W2 of the suspension boards 20 of the inventive examples 1 to 3 and the characteristic impedances of the write wiring traces W3, W4 of the suspension board 21 of the comparative example 1 were examined.

In the suspension board 20 of the inventive example 1, the characteristic impedance of the write wiring trace W1 was 13Ω, and the characteristic impedance of the write wiring trace W2 was 17Ω. Accordingly, the difference between the characteristic impedance of the write wiring trace W1 and the characteristic impedance of the write wiring trace W2 was 4Ω.

In the suspension board 20 of the inventive example 2, the characteristic impedance of the write wiring trace W1 was 13.3Ω, and the characteristic impedance of the write wiring trace W2 was 13.67Ω. Accordingly, the difference between the characteristic impedance of the write wiring trace W1 and the characteristic impedance of the write wiring trace W2 was 0.37Ω.

In the suspension board 20 of the inventive example 3, the characteristic impedance of the write wiring trace W1 was 15.5Ω, and the characteristic impedance of the write wiring trace W2 was 13.5Ω. Accordingly, the difference between the characteristic impedance of the write wiring trace W1 and the characteristic impedance of the write wiring trace W2 was 2Ω.

In the suspension board 21 of the comparative example 1, the characteristic impedance of the write wiring trace W3 was 22.67Ω, and the characteristic impedance of the write wiring trace W4 was 12.71Ω. Accordingly, the difference between the characteristic impedance of the write wiring trace W3 and the characteristic impedance of the write wiring trace W4 was 9.96Ω.

As described above, the difference of the characteristic impedances occurred between the write wiring trace W1 and the write wiring trace W2 in the inventive examples 1 to 3 was sufficiently smaller than the difference of the characteristic impedances occurred between the write wiring trace W3 and the write wiring trace W4 in the comparative example 1. It can be seen from the result that the occurrence of the transmission error of the differential signal because of the imbalance between the write wiring traces W1, W2 can be sufficiently prevented when the differential signal is transmitted through the suspension boards 20 of the inventive examples 1 to 3.

(3-2) Loss in Differential Mode Input and Common Mode Output

Loss in a differential mode input and a common mode output (Scd21) was examined in the suspension boards 20 of the inventive examples 1 to 3 and the suspension board 22 of the comparative example 2.

Figure 10:
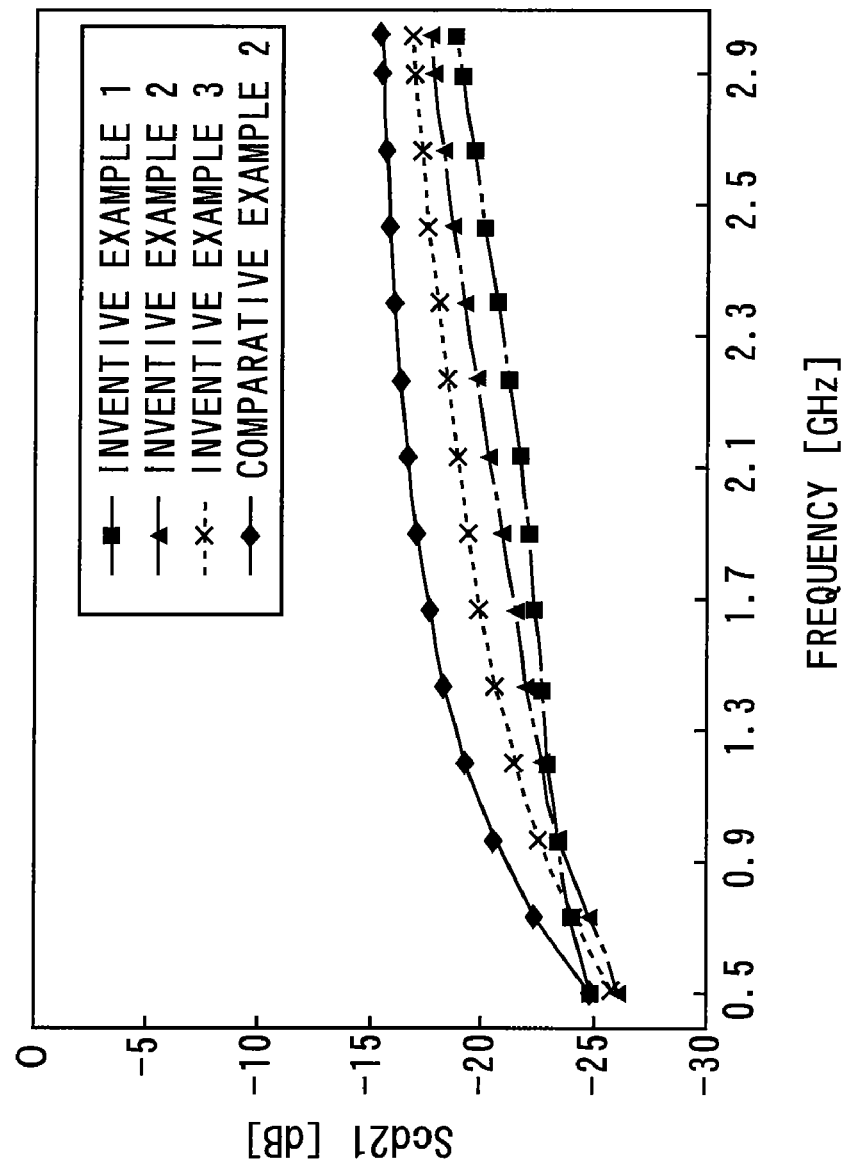
FIG. 10 is a diagram showing results of calculation of loss in a differential mode input and a common mode output.
Figure 11:
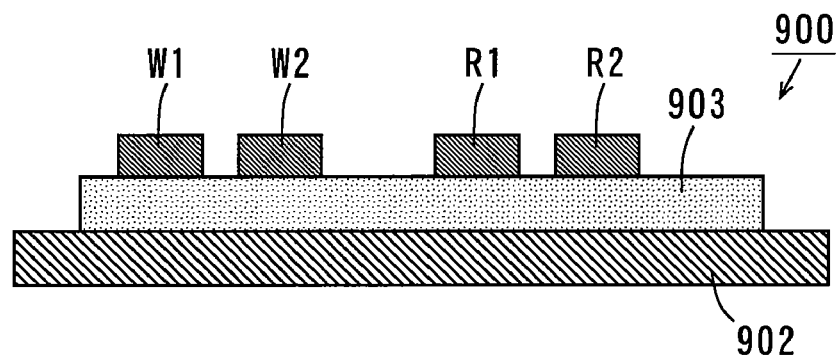
FIG. 11 is a vertical sectional view showing an example of a conventional suspension board.
Figure 12:
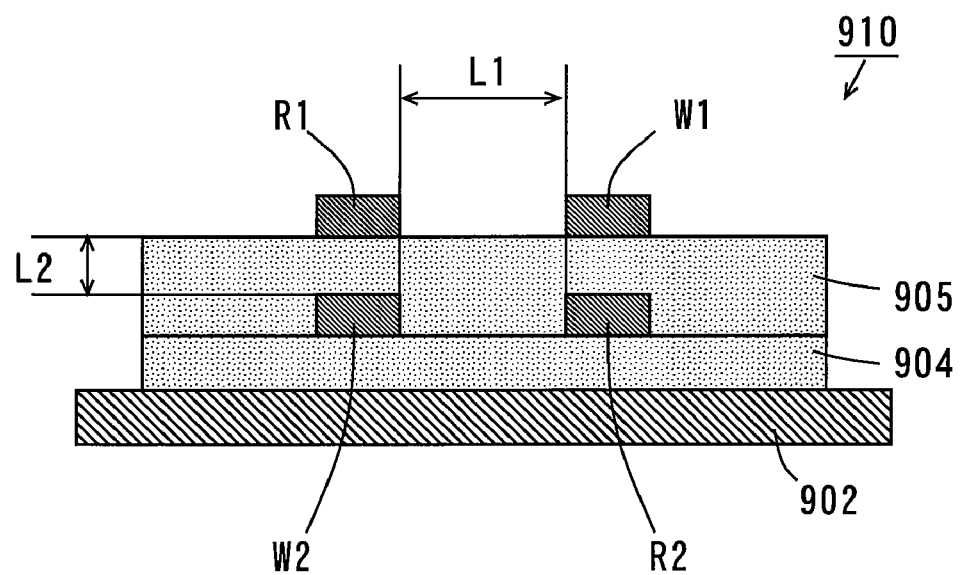
FIG. 12 is a vertical sectional view showing another example of the conventional suspension board.

FIG. 10 is a diagram showing results of calculation of the loss in the differential mode input and the common mode output. In FIG. 10, the ordinate indicates a gain and the abscissa indicates a frequency of a signal. In this case, a negative gain represents the loss.

As shown in FIG. 10, the loss in the suspension boards 20 of the inventive examples 1 to 3 was larger than that in the suspension board 22 of the comparative example 2 in the differential mode input and the common mode output (conversion from the differential mode to the common mode). This shows that the conversion from the differential mode to the common mode is unlikely to be performed in the suspension boards 20 of the inventive examples 1 to 3, as compared with the suspension board 22 of the comparative example 2. It can be seen from the result that the transmission error of the differential signal can be sufficiently prevented when the differential signal is transmitted through the suspension boards 20 of the inventive examples 1 to 3.

Correspondences Between Elements in the Claims and Parts in Embodiments

In the following paragraph, non-limiting examples of correspondences between various elements recited in the claims below and those described above with respect to various preferred embodiments of the present invention are explained.

In the above-described embodiments, the write wiring trace W1 or the read wiring trace R1 is an example of a first wiring trace, the write wiring trace W2 or the read wiring trace R2 is an example of a second wiring trace, the ground trace G1 is an example of a first ground trace, the ground trace G2 is an example of a second ground trace, the ground traces G3, G4 are examples of third and fourth ground traces, the suspension body 10 is an example of a conductive substrate, and a tongue 12 is an example of a head.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board comprising: a conductive substrate; a first insulating layer formed on said conductive substrate; a first wiring trace formed on said first insulating layer; a first ground trace formed on said first insulating layer so as to extend along the first wiring trace on one side of the first wiring trace with a spacing therebetween and configured to be held at a ground potential;
   a second insulating layer formed on said first insulating layer to cover said first wiring trace and said first ground trace;
   a second wiring trace formed on said second insulating layer; and
   a third insulating layer formed on said second insulating layer to cover said second wiring trace, wherein
   said first wiring trace and said second wiring trace are arranged to overlap each other with part of said second insulating layer sandwiched therebetween,
   said first and second wiring traces constitute a first signal line pair that is configured to suppress occurrence of a difference between an impedance of the first wiring trace and an impedance of the second wiring trace and to transmit a differential signal,
   a width of said second wiring trace is set larger than a width of said first wiring trace, at least a partial region of said first ground trace and at least a partial region of said second wiring trace are arranged to overlap each other with part of said second insulating layer sandwiched therebetween.

2. The printed circuit board according to claim 1, further comprising a second ground trace formed on said first insulating layer so as to extend along said first wiring trace on the other side of said first wiring trace with a spacing therebetween, wherein
   at least a partial region of said second ground trace and at least a partial region of said second wiring trace are arranged to be opposite to each other with part of said second insulating layer sandwiched therebetween.

3. The printed circuit board according to claim 1, further comprising third and fourth ground traces formed on said second insulating layer so as to extend along said second wiring trace on one side and the other side of said second wiring trace respectively with spacings therebetween.

4. The printed circuit board according to claim 1, further comprising a head provided on said conductive substrate for reading and writing signals, wherein said first and second wiring traces are electrically connected to said head.

5. The printed circuit board according to claim 1, wherein the first and second wiring traces have overlapping centerlines.

6. A printed circuit board comprising:
   a conductive substrate;
   a first insulating layer formed on said conductive substrate;
   a first wiring trace formed on said first insulating layer;
   a first ground trace formed on said first insulating layer so as to extend along the first wiring trace on one side of the first wiring trace with a spacing therebetween and configured to be held at a ground potential;
   a second insulating layer formed on said first insulating layer to cover said first wiring trace and said first ground trace;
   a second wiring trace formed on said second insulating layer;
   a second ground trace formed on said first insulating layer so as to extend along said first wiring trace on the other side of said first wiring trace with a spacing therebetween and configured to be held at the ground potential, wherein at least a partial region of said second ground trace and at least a partial region of said second wiring trace are arranged to overlap each other with part of said second insulating layer sandwiched therebetween; and
   a third insulating layer formed on said second insulating layer to cover said second wiring trace, wherein
   said first wiring trace and said second wiring trace are arranged to overlap each other with part of said second insulating layer sandwiched therebetween,
   said first and second wiring traces constitute a first signal line pair that is configured to transmit a differential signal,
   a width of said second wiring trace is set larger than a width of said first wiring trace,
   at least a partial region of said first ground trace and at least a partial region of said second wiring trace are arranged to overlap each other with part of said second insulating layer sandwiched therebetween.

7. A printed circuit board comprising:
   a conductive substrate;
   a first insulating layer formed on said conductive substrate;
   a first wiring trace formed on said first insulating layer;
   a first ground trace formed on said first insulating layer so as to extend along the first wiring trace on one side of the first wiring trace with a spacing therebetween and configured to be held at a ground potential;
   a second insulating layer formed on said first insulating layer to cover said first wiring trace and said first ground trace;

a second wiring trace formed on said second insulating layer, wherein the first and second wiring traces are arranged such that a centerline of the first wiring trace and a centerline of the second wiring trace overlap with each other; and a third insulating layer formed on said second insulating layer to cover said second wiring trace, wherein said first wiring trace and said second wiring trace are arranged to overlap each other with part of said second insulating layer sandwiched therebetween, said first and second wiring traces constitute a first signal line pair that is configured to transmit a differential signal, a width of said second wiring trace is set larger than a width of said first wiring trace, at least a partial region of said first ground trace and at least a partial region of said second wiring trace are arranged to overlap each other with part of said second insulating layer sandwiched therebetween.

8. A printed circuit board comprising:

a conductive substrate;

a first insulating layer formed on said conductive substrate;

a first wiring trace formed on said first insulating layer;

a first ground trace formed on said first insulating layer so as to extend along the first wiring trace on one side of the first wiring trace with a spacing therebetween and configured to be held at a ground potential;

a second insulating layer formed on said first insulating layer to cover said first wiring trace and said first ground trace;

a second wiring trace formed on said second insulating layer; and a third insulating layer formed on said second insulating layer to cover said second wiring trace, wherein said first wiring trace and said second wiring trace are arranged to overlap each other with part of said second insulating layer sandwiched therebetween, said first and second wiring traces constitute a first signal line pair that is configured to transmit a differential signal, a width of said second wiring trace is set larger than a width of said first wiring trace, at least a partial region of said first ground trace and at least a partial region of said second wiring trace are arranged to overlap each other with part of said second insulating layer sandwiched therebetween.

* * * * *